(12) United States Patent
Yeom et al.

(10) Patent No.: US 10,910,444 B2
(45) Date of Patent: Feb. 2, 2021

(54) DISPLAY PANEL

(71) Applicant: LG DISPLAY CO., LTD., Seoul (KR)

(72) Inventors: SeoJun Yeom, Goyang-si (KR); DongKug Ko, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/191,655

(22) Filed: Nov. 15, 2018

(65) Prior Publication Data
US 2019/0148464 A1 May 16, 2019

(30) Foreign Application Priority Data
Nov. 15, 2017 (KR) .................. 10-2017-0152579

(51) Int. Cl.
*H01L 29/08* (2006.01)
*H01L 35/24* (2006.01)
(Continued)

(52) U.S. Cl.
CPC ....... *H01L 27/3213* (2013.01); *G09G 3/3233* (2013.01); *H01L 27/326* (2013.01); *H01L 27/3262* (2013.01); *H01L 27/3265* (2013.01); *H01L 27/3272* (2013.01); *H01L 27/3276* (2013.01); *G09G 2300/0452* (2013.01);
(Continued)

(58) Field of Classification Search
CPC ............. H01L 27/3276; H01L 27/3213; H01L 27/3218; H01L 27/3262; H01L 27/3265; H01L 2227/323; H01L 27/3211; H01L 27/3246; H01L 27/3258; H01L 27/326; H01L 27/3272; H01L 51/5203; H01L 51/5209; H01L 51/5284; H01L 51/56; G09G 2310/0278; G09G 2310/08; G09G 3/3233; G09G 2300/0452; G09G 2310/0251; G09G 2310/0262
See application file for complete search history.

(56) References Cited

U.S. PATENT DOCUMENTS

| | | | |
|---|---|---|---|
| 2015/0311261 A1* | 10/2015 | Choi | H01L 27/322 257/40 |
| 2017/0132977 A1* | 5/2017 | Kim | G09G 3/3225 |
| 2019/0164502 A1* | 5/2019 | Yoon | H01L 27/3276 |

* cited by examiner

*Primary Examiner* — Meiya Li
(74) *Attorney, Agent, or Firm* — Polsinelli PC

(57) ABSTRACT

The present disclosure provides a display panel. The display panel includes the plurality of unit pixels arranged in a matrix within the display region, wherein each unit pixel includes first, second, third and fourth sub-pixels which are sequentially arranged in a row in a first direction and correspond to different colors. The data-line corresponds to a vertical line including sub-pixels arranged in a line in the second direction orthogonal to the first direction. The data-line includes: a straight-shaped portion disposed along and between adjacent non-light emitting regions and extending in the second direction; and a multi angle-shaped portion disposed along and between adjacent light-emitting regions, wherein the multi angle-shaped portion includes: an inclined line inclined relative to the second direction; and a straight-shaped portion extending in the first direction. Thus, a minimum space between the light-emitting regions of the outer first and fourth sub-pixels defining the outer sub-pixels of the unit pixel may be smaller than a space between the non-light emitting regions thereof. Therefore, color mixing between the light beams as emitted from the outer first and fourth sub-pixels may be easily rendered.

20 Claims, 11 Drawing Sheets

(51) Int. Cl.
*H01L 51/00* (2006.01)
*H01L 27/32* (2006.01)
*G09G 3/3233* (2016.01)
*H01L 51/52* (2006.01)

(52) U.S. Cl.
CPC ............... *G09G 2310/0251* (2013.01); *G09G 2310/0262* (2013.01); *G09G 2310/0278* (2013.01); *G09G 2310/08* (2013.01); *H01L 27/3218* (2013.01); *H01L 51/5209* (2013.01); *H01L 2227/323* (2013.01)

DISPLAY PANEL

CROSS-REFERENCE TO RELATED APPLICATIONS

This application claims the priority of Korean Patent Application No. 10-2017-0152579 filed on Nov. 15, 2017, in the Korean Intellectual Property Office, the disclosure of which is hereby incorporated by reference in its entirety.

BACKGROUND

Field of the Disclosure

The present disclosure relates to a display panel that includes a plurality of unit pixels arranged in a matrix form in a display region, and, in which each unit pixel includes four sub-pixels corresponding to different colors.

Description of the Background

A display device is applied to various electronic devices such as TVs, mobile phones, notebooks and tablets. Researches to achieve thinning, weight-saving and low-power consumption for the display device have been continued.

A typical example of the display device may include a liquid crystal display device (LCD), a plasma display device (PDP), a field emission display device (FED), an electroluminescence display device (ELD), an electro-wetting display device (EWD) and an organic light emitting display device (OLED).

Such a panel display device generally includes a flat display panel in which image display is implemented and a drive unit for driving the display panel.

The display panel may include a pair of substrates bonded to each other and a polarizing material or a light emitting material disposed between the pair of substrates. Further, the display panel includes a plurality of unit pixels arranged in a matrix form in a display region where an image is displayed. Each of the unit pixels may emit light corresponding to each image frame.

Further, in order for the display panel to display a color image, each unit pixel may contain two or more sub-pixels corresponding to different elementary colors. In this connection, the elementary colors may include red, green, and blue.

Further, in order to improve white luminance of each unit pixel, each unit pixel may further include a sub-pixel corresponding to white. In this case, each unit pixel may be composed of four sub-pixels corresponding to red, green, blue, and white.

Each of the unit pixels displays a predetermined color using a mixed color of light beams as emitted from two or more sub-pixels corresponding to different colors, each of which emits a light beam of each luminance and each color.

However, when each unit pixel includes four sub-pixels arranged in one direction, two outer sub-pixels are spaced apart by a space corresponding to a sum of dimensions of two inner sub-pixels disposed therebetween. This cause a problem that a mixed color of light-beams emitted from the two outer sub-pixels may not be rendered. That is, colors corresponding to the two outer sub-pixels are individually recognized.

In particular, when each of the sub-pixels extends in a vertical direction, there is a problem that there may occur a color line defect in which colors corresponding to two outer sub-pixels of each unit pixel are individually rendered in the form of a vertical line.

SUMMARY

The present disclosure is intended to provide a display panel in which the mixed color of light-beams emitted from the two outer sub-pixels of each unit pixel may be easily rendered.

The purposes of the present disclosure are not limited to the above-mentioned purposes. Other purposes and advantages of the present disclosure, as not mentioned above, may be understood from the following descriptions and more clearly understood from the aspects of the present disclosure. Further, it will be readily appreciated that the objects and advantages of the present disclosure may be realized by features and combinations thereof as disclosed in the claims.

In one aspect of the present disclosure, there is provided a display panel, wherein the display panel includes a plurality of unit pixels arranged in a matrix within the display region, wherein each unit pixel includes first, second, third and fourth sub-pixels which are sequentially arranged in a row in a first direction and correspond to different colors, wherein the display panel includes: an organic light-emitting element disposed in a light-emitting region of each of the first, second, third and fourth sub-pixels; circuitry disposed in a non-light emitting region of each of the first, second, third and fourth sub-pixels, wherein the circuitry is configured to supply a driving current to the organic light-emitting element; and a data-line corresponding to a vertical line including sub-pixels arranged in a line in a second direction orthogonal to the first direction, wherein the data-line includes: a straight-shaped portion disposed along and between adjacent non-light emitting regions and extending in the second direction; and a multi angle-shaped portion disposed along and between adjacent light-emitting regions, wherein the multi angle-shaped portion includes: an inclined line inclined relative to the second direction; and a straight-shaped portion extending in the first direction.

In one aspect, a combination of the first and second sub-pixels is symmetrical with a combination of the third and fourth sub-pixels around a boundary line between the second and third sub-pixels.

In one aspect, a space between the non-light emitting regions of the first and fourth sub-pixels is defined as a first value, wherein a space between at least portions of the light-emitting regions of the first and fourth sub-pixels varies between a second value and a third value, wherein the second value is smaller than the first value, and the third value is greater than the first value.

In one aspect, the data-line includes a first pair of adjacent two data lines disposed along and between the first and second sub-pixels, and a second pair of adjacent two data lines disposed along and between the third and fourth sub-pixels, wherein the first pair of the adjacent two data lines is symmetrical with the second pair of the adjacent two data lines around a boundary line between the second and third sub-pixels.

In one aspect, the straight-shaped portion extending in the second direction and the multi angle-shaped portion are disposed in the same vertical level.

In one aspect, at least a portion of the multi angle-shaped portion is disposed at a vertical level different from a vertical level of the straight-shaped portion, wherein the at least a portion of the multi angle-shaped portion is connected via a contact hole to the straight-shaped portion extending in the second direction, wherein a remaining portion of the multi angle-shaped portion is disposed at the same vertical level as the straight-shaped portion extending in the second direction.

In one aspect, the straight-shaped portion extending in the first direction of the multi angle-shaped portion of the data-line is disposed at a vertical level different from a vertical level of the straight-shaped portion, wherein the inclined line of the multi angle-shaped portion is disposed at the same vertical level as the straight-shaped portion extending in the second direction.

In one aspect, the display panel further includes: a first power supply line for supplying a first drive voltage; and a reference power supply line for supplying a reference voltage, wherein each of the first power supply line and the reference power supply line corresponds to two or more vertical lines and extends linearly in the second direction, wherein one of the first power supply line and the reference power supply line is disposed along and between the second and third sub-pixels, while the other thereof is disposed along between a first sub-pixel of one of adjacent unit pixels and a fourth sub-pixel of the other of the adjacent unit pixels.

In one aspect, the circuitry includes: a first thin-film transistor disposed between the first power supply line and a second power supply line for supplying a second drive voltage lower than the first drive voltage, wherein the first thin-film transistor is connected in series with the organic light-emitting element for supplying the driving current to the organic light-emitting element; a storage capacitor disposed between a first node connected to a gate electrode of the first thin-film transistor and a second node between the first thin-film transistor and the organic light-emitting element; a second thin-film transistor coupled between the first node and the data-line; and a third thin-film transistor coupled between the second node and the reference power supply line.

In one aspect, at least one of the first, second, and third thin-film transistors includes: a light-shielding layer disposed on a substrate; an active layer disposed on a buffer insulating-film covering the light-shielding layer, wherein the active layer overlaps the light-shielding layer; a gate electrode disposed on a gate insulating-film covering the active layer, wherein the gate electrode partially overlaps the active layer; and source and drain electrodes disposed on an interlayer insulating-film covering the active layer and the gate electrode, wherein the source and drain electrodes respectively overlap with both lateral edges of the active layer.

In one aspect, the data-line, the first power supply line, and the reference power supply line are disposed on the interlayer insulating-film.

In one aspect, the first power supply line and the reference power supply line are disposed on the interlayer insulating-film, wherein the straight-shaped portion extending in the second direction of the data-line is disposed on the interlayer insulating-film, wherein at least a portion of the multi angle-shaped portion of the data-line is disposed at a vertical level different from a vertical level of the straight-shaped portion extending in the second direction; wherein the at least portion of the multi angle-shaped portion of the data-line is connected via a contact hole to the straight-shaped portion extending in the second direction, wherein a remaining portion of the multi angle-shaped portion is disposed on the interlayer insulating-film.

In one aspect, the display panel further includes: an intermediate insulating film disposed between the gate insulating-film and the interlayer insulating-film; a first bridge pattern disposed on the intermediate insulating-film and connected to the first power supply line via a contact hole; and a second bridge pattern disposed on the intermediate insulating-film and connected to the reference power supply line via a contact hole.

In one aspect, the straight-shaped portion extending in the first direction of the multi angle-shaped portion of the data-line is disposed on one of the substrate, the buffer insulating-film, the gate insulating-film, and the intermediate insulating-film.

In one aspect, the first and fourth sub-pixels define outer sub-pixels of the unit pixel in the first direction, wherein one of the first and fourth sub-pixels corresponds to red and the other thereof corresponds to green, wherein the second and third sub-pixels define inner sub-pixels of the unit pixel in the first direction and are disposed between the outer first and fourth sub-pixels, wherein one of the inner second and third sub-pixels corresponds to white and the other thereof corresponds to blue.

In accordance with the present disclosure, the display panel includes the plurality of unit pixels arranged in a matrix within the display region, wherein each unit pixel includes first, second, third and fourth sub-pixels which are sequentially arranged in a row in a first direction and correspond to different colors. The data-line corresponds to a vertical line including sub-pixels arranged in a line in the second direction orthogonal to the first direction. The data-line includes: a straight-shaped portion disposed along and between adjacent non-light emitting regions and extending in the second direction; and a multi angle-shaped portion disposed along and between adjacent light-emitting regions, wherein the multi angle-shaped portion includes: an inclined line inclined relative to the second direction; and a straight-shaped portion extending in the first direction.

In this way, due to the configuration that the data-line includes the multi angle-shaped portion having the inclined line and the straight-shaped portion extending in the first direction which are disposed along and between the light-emitting regions, the light-emitting regions of the two adjacent sub-pixels in the first direction protrude at sides thereof facing each other so as to be symmetrically shaped in an inclined direction.

Further, in accordance with the present disclosure, the combination of the first and second sub-pixels is symmetrical with the combination of the third and fourth sub-pixels around a boundary line between the second and third sub-pixels. Thus, a minimum space between the light-emitting regions of the outer first and fourth sub-pixels defining the outer sub-pixels of the unit pixel may be smaller than a space between the non-light emitting regions thereof. Therefore, color mixing between the light beams as emitted from the outer first and fourth sub-pixels may be easily rendered. This may suppress the color line defect.

BRIEF DESCRIPTION OF DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
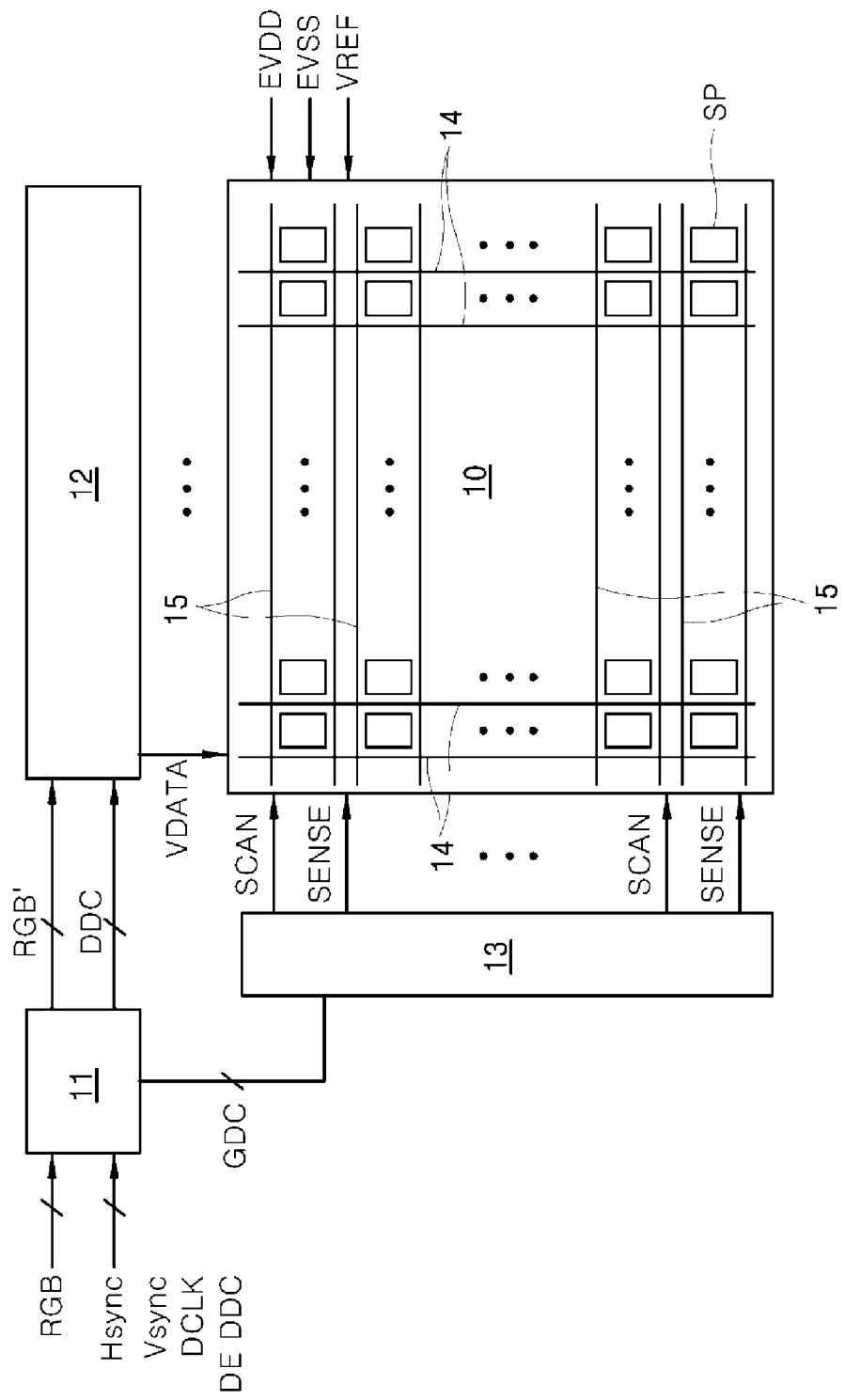
FIG. 1 illustrates an organic light-emitting display device according to a first aspect of the present disclosure.

Examples of various aspects are illustrated and described further below. It will be understood that the description herein is not intended to limit the claims to the specific aspects described. On the contrary, it is intended to cover alternatives, modifications, and equivalents as may be included within the spirit and scope of the present disclosure as defined by the appended claims.

The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for describing particular aspects only and is not intended to be limiting of the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, display panels according to various aspects of the present disclosure will be described in detail with reference to the accompanying drawings.

Initially referring to FIG. 1 and FIG. 2, an organic light-emitting display device according to a first aspect of the present disclosure and a display panel provided therein will be described.

FIG. 1 illustrates an organic light-emitting display device according to a first aspect of the present disclosure. FIG. 2 shows one example of equivalent circuitry corresponding to four sub-pixels constituting one unit pixel arranged in the display region of the display panel shown in FIG. 1.

As shown in FIG. 1, the organic light-emitting display device according to the first aspect of the present disclosure includes a display panel 10 including a plurality of unit pixels arranged in a matrix within a display region in which images are displayed; a data drive unit 12 for driving data-lines 14 of the display panel 10, a gate drive unit 13 for driving scan-lines 15 of the display panel 10, and a timing controller 11 for controlling a driving timing of each of the data drive unit 12 and the gate drive unit 13.

Each of the plurality of unit pixels includes two or more sub-pixels SP corresponding to different colors. Each sub-pixel SP is positioned within each sub-pixel region defined by intersecting scan-line 15 and data-line 14.

Further, the display panel 10 includes scan-lines 15, each corresponding to each horizontal line including sub-pixels SP arranged in a horizontal direction, and data-lines 14, each corresponding to a vertical line including sub-pixels SP arranged in a vertical direction.

Although not shown in detail in FIG. 1, the scan-line 15 corresponding to each horizontal line includes a first scan line for supplying a scan signal SCAN for selecting a corresponding horizontal line during writing data in a corresponding sub-pixel SP, and a second scan line for supplying a sense signal SENSE for selecting a corresponding horizontal line during initialization of data in the sub-pixel SP.

Further, the display panel 10 includes a first power supply line for supplying a first drive voltage EVDD, a second power supply line for supplying a second drive voltage EVSS lower than the first drive voltage EVDD, and a reference power supply line for supplying a reference voltage VREF. In this connection, each of the first power supply line and the reference power supply line may correspond to two or more vertical lines. Further, the first drive voltage VDD, the second drive voltage VSS, and the reference voltage VREF may be supplied by the data drive unit 12.

The timing controller 11 rearranges digital video data RGB input from the outside according to a resolution of the display panel 10 and supplies the rearranged digital video data RGB' to the data drive unit 12.

Further, the timing controller 11 generates and supplies a data control signal DDC for controlling an operation timing of the data drive unit 12 and a gate control signal GDC for controlling an operation timing of the gate drive unit 13, based on timing signals such as a vertical synchronization signal Vsync, a horizontal synchronization signal Hsync, a dot clock signal DCLK, and a data enable signal DE DDC.

The data drive unit 12 converts the rearrange digital video data RGB' into an analog data voltage based on the data control signal DDC. Further, the data drive unit 12 supplies a data signal VDATA to pixels via the data-line 15 for each horizontal period, based on the rearranged digital video data RGB'.

The gate drive unit 13 supplies the scan signal SCAN and the sense signal SENSE corresponding to each horizontal line based on the gate control signal GDC.

Figure 2:
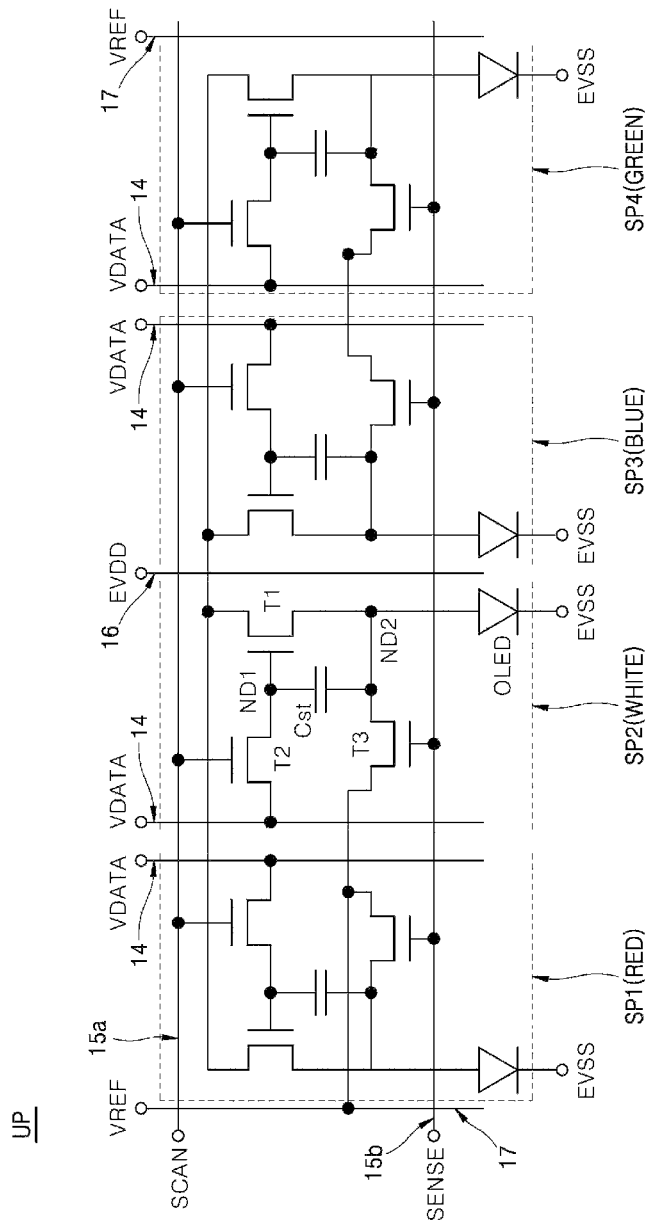
FIG. 2 shows one example of equivalent circuitry corresponding to four sub-pixels constituting one unit pixel arranged in a display region of the display panel as shown in FIG. 1.

As shown in FIG. 2, one unit pixel UP disposed in the display panel 10 includes first, second, third, and fourth sub-pixels SP1, SP2, SP3, and SP4 corresponding to different colors and arranged in a first direction (i.e., X direction).

In this connection, the first, second, third and fourth sub-pixels SP1, SP2, SP3 and SP4 may correspond to red, green, blue and white colors, respectively. In one example, one of the first and fourth sub-pixels SP1 and SP4 disposed at outer locations of each unit pixel UP may correspond to a red color, while the other thereof may correspond to a green color. Further, one of the second and third sub-pixels SP2 and SP3 disposed between the first and fourth sub-pixels SP1 and SP4 may correspond to a white color while the other thereof may correspond to a blue color. That is, as shown in FIG. 2, the first, second, third, and fourth sub-pixels SP1, SP2, SP3, and SP4 may sequentially correspond to red, white, blue, and green colors.

The display panel (shown as 10 in FIG. 1) includes the first scan-line 15a for supplying the scan signal SCAN to each horizontal line, and the second scan-line 15b for supplying the sense signal SENSE to each horizontal line.

Further, the display panel (shown as 10 in FIG. 1) includes the first power supply line 16 for supplying the first drive voltage EVDD, the second power supply line for supplying the second drive voltage EVSS, and the reference power supply line 17 for supplying the reference voltage VREF.

Each of the first, second, third and fourth sub-pixels SP1, SP2, SP3 and SP4 includes an organic light-emitting element OLED, a storage capacitor Cst, a first thin film transistor T1, a second thin film transistor T2, and a third thin film transistor T3. In this connection, the organic light-emitting element OLED may be placed in the light-emitting region (EA in FIG. 3) of each sub-pixel. Circuitry for supplying a driving current to the organic light-emitting element OLED includes the storage capacitor Cst, and the first, second and third thin-film transistors T1, T2 and T3, and is positioned in the non-light emitting region (NEA in FIG. 3) of each sub-pixel.

The organic light-emitting element OLED includes an anode and a cathode, and an organic light-emitting layer (not shown) disposed therebetween. In one example, the organic light-emitting layer includes a hole injection layer, a hole transport layer, a light emitting layer, and an electron transport layer. Alternatively, the organic light-emitting layer may further include an electron injection layer.

The first thin-film transistor T1 is disposed between the first power supply line 16, which supplies the first drive voltage EVDD, and the second power supply line, which supplies the second drive voltage EVSS below the first drive voltage EVDD. The first thin-film transistor T1 is connected in series with the organic light-emitting element OLED.

The storage capacitor Cst is disposed between a first node ND1 connected to a gate electrode of the first thin-film transistor T1 and a second node ND2 between the first thin-film transistor T1 and the organic light-emitting element OLED. That is, since the gate electrode of the first thin-film transistor T1 is connected to the storage capacitor Cst, the first thin-film transistor T1 is turned on based on a charged voltage of the storage capacitor Cst.

Further, when the first thin-film transistor T1 is turned on, a driving current is supplied to the organic light-emitting element OLED.

The second thin-film transistor T2 is connected between the first node ND1 and the data-line 14. When the second thin-film transistor T2 is turned on based on the scan signal SCAN from the first scan-line 15a, the first node ND1 is supplied with the data signal VDATA from the data-line 14.

The third thin-film transistor T3 is connected between the second node ND2 and the reference power supply line 17. When the third thin-film transistor T3 is turned on based on the sense signal SENSE from the second scan-line 15b, the second node ND2 is supplied with the reference voltage VREF.

Next, the display panel according to the first aspect of the present disclosure will be described with reference to FIG. 3 to FIG. 6.

Figure 3:
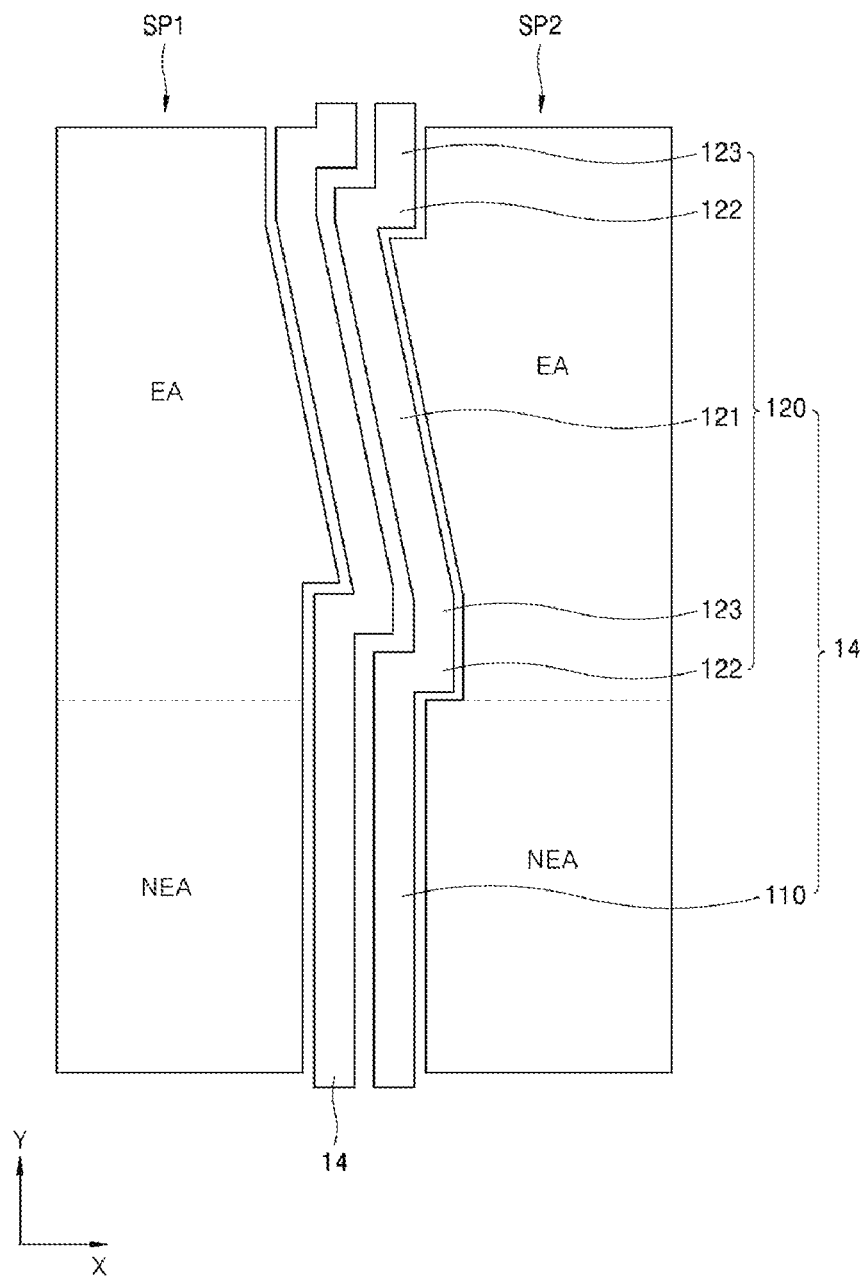
FIG. 3 shows two adjacent sub-pixels and corresponding data-lines in the display panel according to the first aspect of the present disclosure.
Figure 4:
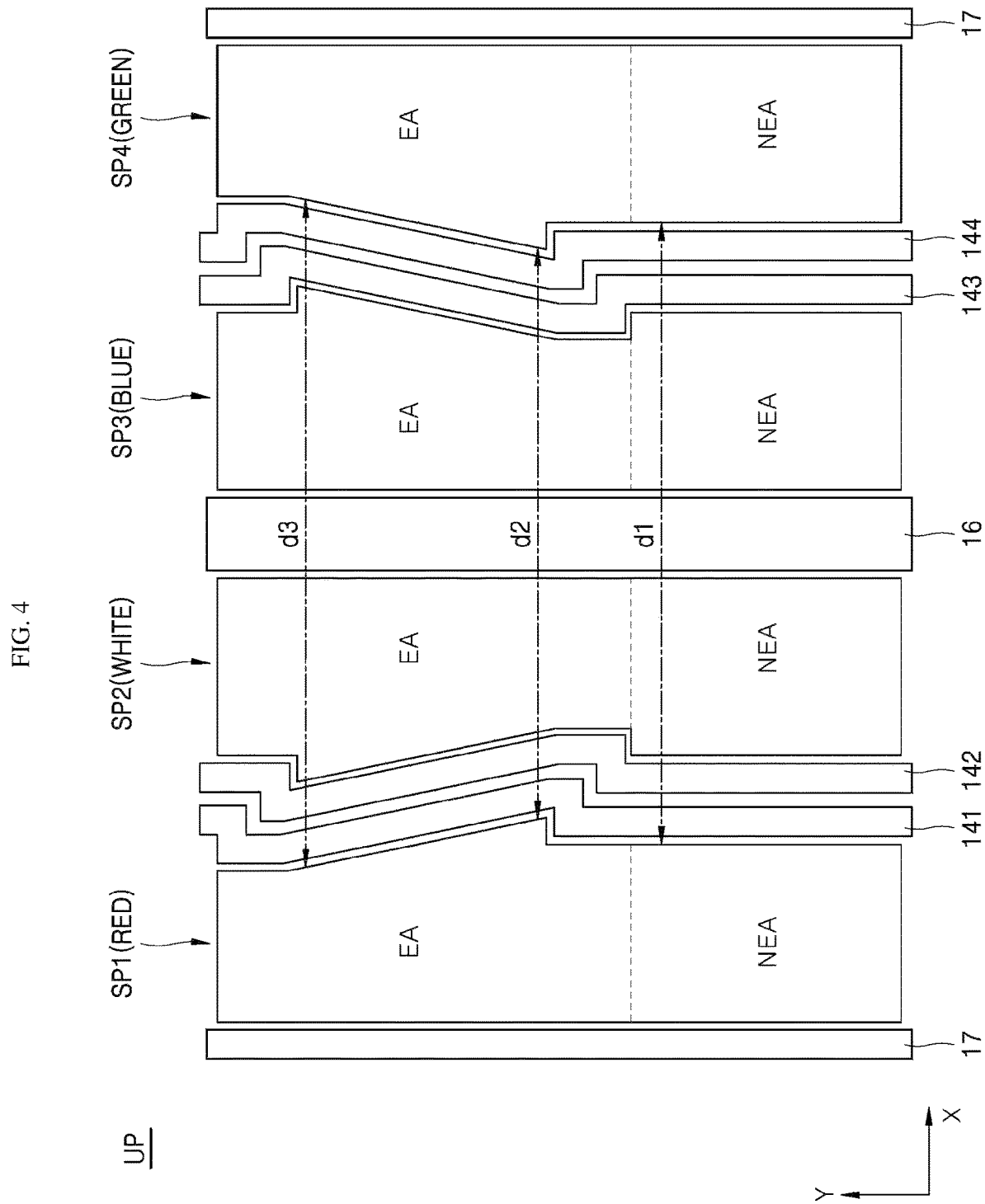
FIG. 4 shows first, second, third and fourth sub-pixels corresponding to any one unit pixel in the display panel according to the first aspect of the present disclosure.
Figure 5:
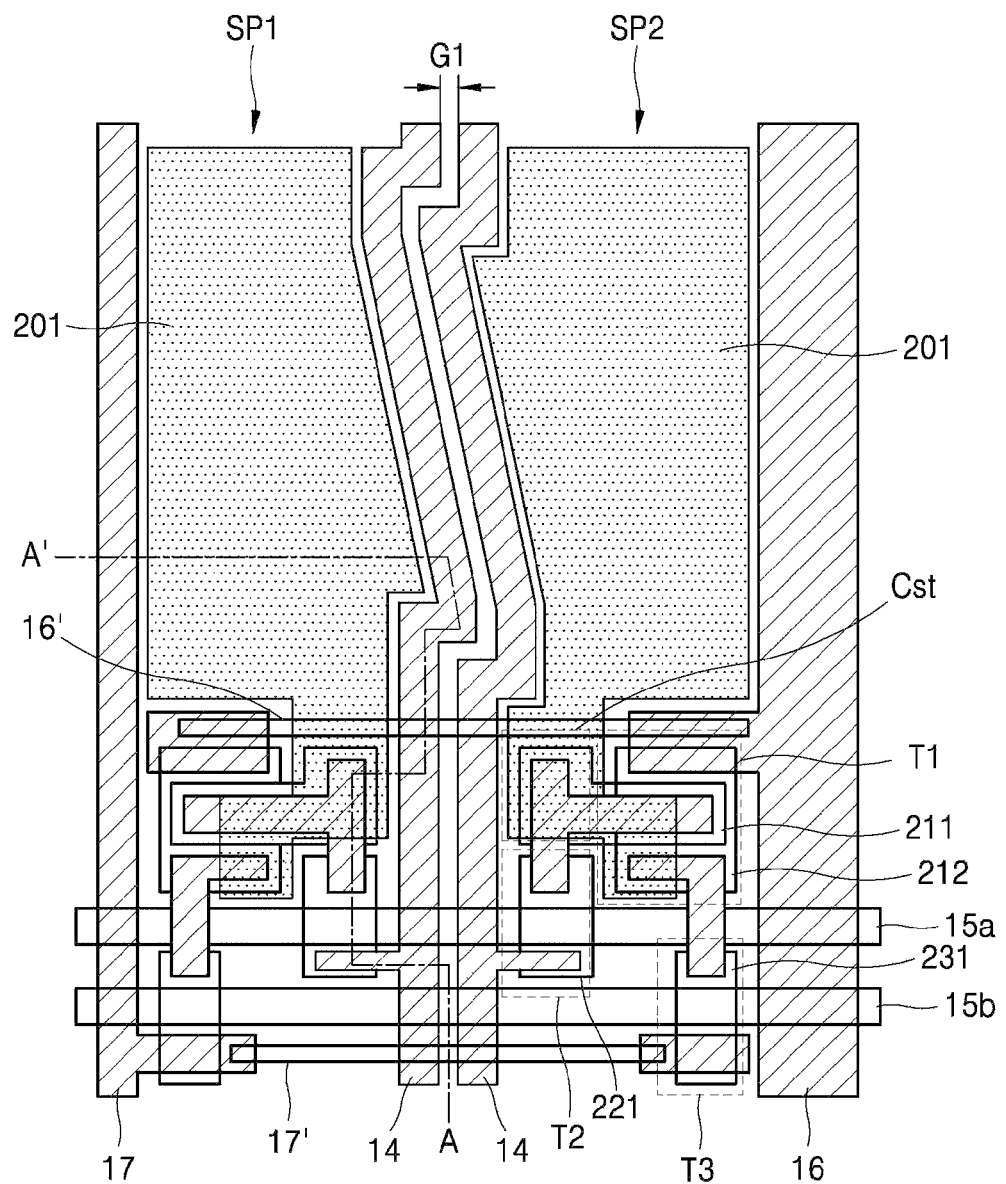
FIG. 5 shows one example of circuitry placed in a non-light emitting region of each sub-pixel in FIG. 3.
Figure 6:
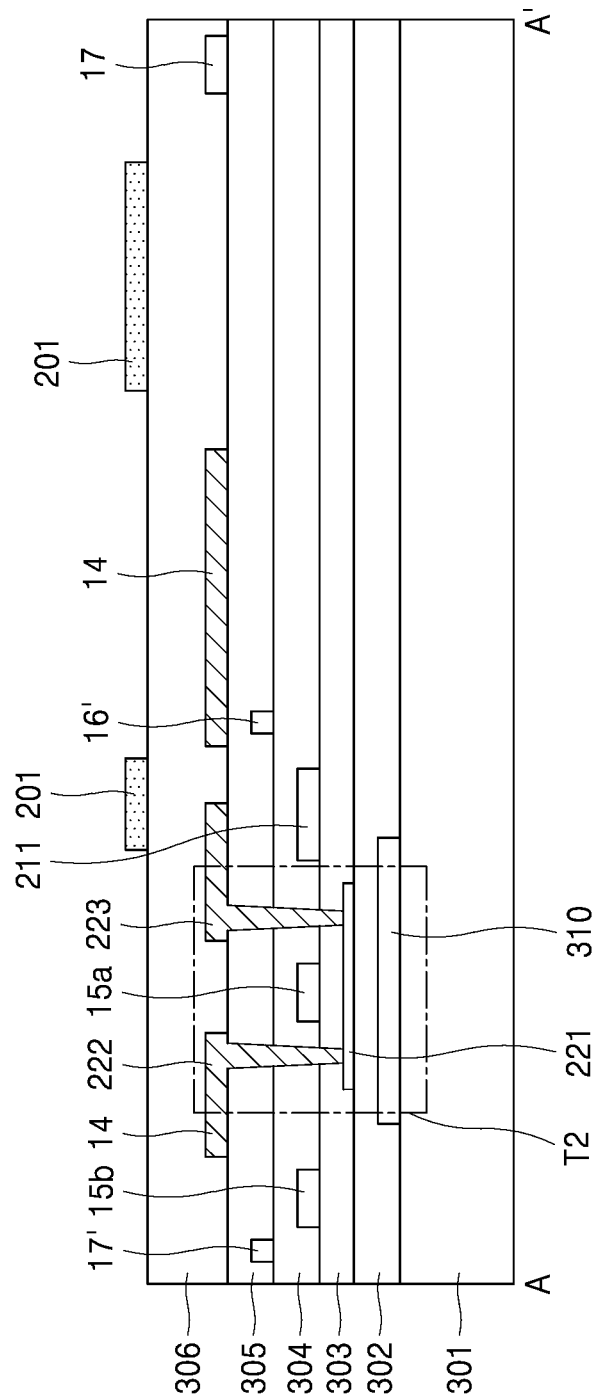
FIG. 6 is a cross-sectional view taken along line A-A' of FIG. 5.

FIG. 3 shows two adjacent sub-pixels and corresponding data-lines in the display panel according to the first aspect of the present disclosure. FIG. 4 shows the first, second, third and fourth sub-pixels corresponding to one unit pixel in the display panel according to the first aspect of the present disclosure. FIG. 5 shows one example of the circuitry disposed in the non-light emitting region of each sub-pixel in FIG. 3. FIG. 6 is a cross-sectional view as taken along line A-A' of FIG. 5.

As shown in FIG. 3, each of two adjacent sub-pixels SP1 and SP2 arranged in the first direction X includes the light-emitting region EA in which the organic light-emitting element (OLED in FIG. 2) is disposed, and the non-light emitting region NEA in which the circuitry for supplying the driving current to the OLED is disposed. In this connection, the circuitry may include the storage capacitor (Cst in FIG. 2), and the first, second, and third thin-film transistors (T1, T2, T3 in FIG. 2).

For luminance uniformity between the sub-pixels SP1 and SP2, the sub-pixels SP1 and SP2 have first and second circuitry matching each other. Thus, the non-light emitting regions NEAs of the sub-pixels SP1 and SP2 may be spaced apart by a predetermined space and have the same width as each other.

Further, according to the first aspect of the present disclosure, the light-emitting regions EAs of the two adjacent sub-pixels SP1 and SP2 protrude at sides thereof facing each other so as to be symmetrically shaped in a diagonal direction.

To this end, the data-lines 14 corresponding to each vertical line extend along and between the light-emitting regions EAs of the adjacent inner sub-pixels SP1 and SP2. An inclined line 121 relative to the first and second directions X and Y is defined along and between the light-emitting regions EAs of the adjacent inner sub-pixels SP1 and SP2.

Specifically, the two data-lines 14 corresponding to the two adjacent sub-pixels SP1 and SP2 arranged in the first direction X may be disposed along and between the two adjacent sub-pixels SP1 and SP2.

Further, each data-line 14 includes a straight-shaped portion 110 disposed along and between the non-light emitting regions NEAs of the adjacent inner sub-pixels SP1 and SP2, and a multi angle-shaped portion 120 disposed along and between the light-emitting regions EAs of the adjacent inner sub-pixels SP1 and SP2.

The straight-shaped portion 110 has a straight-line shape parallel to the second direction Y.

The multi angle-shaped portion 120 includes an inclined line 121 extending in an oblique manner relative to the first direction X and the second direction Y, and a straight line 122 extending parallel to the first direction X.

That is, the multi angle-shaped portion 120 includes at least one inclined line 121 and two or more straight lines 122 and 123 extending from both ends of the inclined line 121. Thus, the inclined line 121 and the two straight lines 122 and 123 together define multiple angles.

In one example, as shown in FIG. 3, the multi angle-shaped portion 120 includes one inclined line 121, a first straight line 122 extending in the first (X) direction from one end of the inclined line 121, a second straight line 122 extending in the first (X) direction from the other end of the inclined line 121, a first straight line 123 extending in the second (Y) direction from the first portion 122, and a second straight line 123 extending in the second (Y) direction from the second portion 122.

In this way, the multi angle-shaped portion 120 of the data-line 14 includes at least one inclined line 121, such that the light-emitting regions EAs of the two adjacent sub-pixels SP1 and SP2 protrude at sides thereof facing each other so as to be symmetrically shaped in an inclined direction.

Further, the multi angle-shaped portion 120 includes the first and second straight lines 122 extending parallel to the first direction X from both ends of the inclined line 121 respectively. Thus, the non-light emitting regions NEAs of the sub-pixels SP1 and SP2 may have the same width and the space between the non-light emitting regions NEAs may be constant. In this connection, the straight line 122 extending in the first direction may be directly connected to one end of the inclined line 121. Alternatively, the straight line 122 extending in the first direction may be indirectly connected to one end of the inclined line 121 via the straight line 123 extending in the second direction therebetween.

As long as the multi angle-shaped portion 120 of the data-line 14 includes at least one inclined line 121, the shape of the multi angle-shaped portion 120 is not limited to a particular shape. That is, it is possible to deform the shape of the multi angle-shaped portion 120. One modified aspect will be described below with reference to FIG. 11.

As shown in FIG. 4, the display panel (10 in FIG. 1) may further include the first power supply line 16 for supplying the first drive voltage (EVDD in FIG. 2) and the reference power supply 17 for supplying the reference voltage (VREF in FIG. 2).

Each of the first power supply line 16 and the reference power supply line 17 may correspond to two or more vertical lines and have a straight line shape extending in the second direction Y.

In one example, the first power supply line 16 may be configured to supply the first drive voltage EVDD to the four sub-pixels SP1 and SP2, SP3, SP4 corresponding to each unit pixel UP.

Further, the reference power supply line 17 may be configured to supply the reference voltage VREF to two adjacent sub-pixels SP1 and SP2 or two adjacent sub-pixels SP3 and SP4.

One of the first power supply line 16 and the reference power supply line 17 may be disposed along and between the second and third sub-pixels SP2 and SP3 and the other thereof may be disposed along and between the first and fourth sub-pixels SP1 and SP4.

That is, as shown in FIG. 4, the first power supply line 16 may be disposed along and between the second and third sub-pixels SP2 and SP3, while the reference power supply line 17 may be disposed between adjacent unit pixels UP, i.e. between adjacent first and fourth sub-pixels SP1 and SP4.

Each unit pixel UP has the first, second, third and fourth sub-pixels SP1, SP2, SP3, and SP4 corresponding to different colors and arranged in a line in the first direction.

In this connection, the first, second, third and fourth sub-pixels SP1, SP2, SP3 and SP4 may correspond to red color, green color, blue color and white color respectively. In one example, one of the outer first and fourth sub-pixels SP1 and SP4 of each unit pixel UP corresponds to a red color, and the other thereof corresponds to a green color. Further, one of the second and third inner sub-pixels SP2 and SP3 disposed between the first and fourth sub-pixels SP1 and SP4 corresponds to a white color while the other thereof corresponds to a blue color.

The first, second, third and fourth sub-pixels SP1, SP2, SP3 and SP4 each may include the light-emitting region EA in which the organic light-emitting element (OLED in FIG. 2) for emitting a light-beam is disposed, and the non-light emitting region NEA in which the circuitry for supplying the driving current to the OLED is disposed. In this connection, the circuitry may include the storage capacitor (Cst in FIG. 2), and the first, second, and third thin-film transistors (T1, T2, T3 in FIG. 2).

Each data-line 141, 142, 143, or 144 includes the vertically straight-shaped portion (110 in FIG. 3) corresponding to each of the non-light-emitting regions NEAs of the sub-pixels SP1, SP2, SP3 and SP4, and the multi angle-shaped portion (120 in FIG. 3) corresponding to each of the light-emitting regions EAs of SP1, SP2, SP3 and SP4. In this connection, the vertically straight-shaped portion 110 has a straightly-extending shape in the second direction Y. The multi angle-shaped portion 120 includes at least one inclined line (121 in FIG. 3) and two straight lines (122 and 123 in FIG. 3) respectively extending from both ends of the inclined line extending in the first direction X.

Due to the configuration of the data lines 141, 142, 143 and 144, the two non-light emitting regions NEAs of the two sub-pixels SP1 and SP2 adjacent in the first direction have the same shape, and the non-light emitting regions NEAs of the sub-pixels SP3 and SP4 have the same shape. Further, the two light-emitting regions EAs of the sub-pixels SP1 and SP2 adjacent in the first direction are projected in a mutually facing direction, i.e., towards the data-lines 141 and 142 respectively. The two light-emitting regions EAs of the two sub-pixels SP3 and SP4 adjacent in the first direction are projected in a mutually opposite direction, i.e. towards the data-lines 143 and 144 respectively.

In addition, the two data-lines 141 and 142 corresponding to the first and second sub-pixels SP1 and SP2 may extend along and between the first and second sub-pixels SP1 and SP2. The two data lines 143 and 144 corresponding to the third and fourth sub-pixels SP3 and SP4 may extend along and between the third and fourth sub-pixels SP3 and SP4.

Further, the two data-lines 141 and 142 disposed between the first and second sub-pixels SP1 and SP2 and the two data-lines 143 and 144 disposed between the third and fourth sub-pixels SP3 and SP4 may be line-symmetrical with each other around a boundary line between the second sub-pixel SP2 and the third sub-pixel SP3 corresponding to a central line of each unit pixel UP.

Thus, the first and second sub-pixels SP1 and SP2 defining the left half of each unit pixel UP and the third and fourth sub-pixels SP3 and SP4 defining the right half of each unit pixel UP may have symmetrical shapes with each other around the boundary line between the second sub-pixel SP2 and the third sub-pixel SP3 corresponding to a central line of each unit pixel UP.

Thus, the light-emitting regions EAs of the outer first and fourth sub-pixels SP1 and SP4 of each unit pixel UP have respective zones protruding in a mutually facing direction.

Thus, when a space between the non-light emitting regions NEAs of the first and fourth sub-pixels SP1 and SP4 is defined as a first distance d1, a space between the protruding zones of the light-emitting regions EA of the first and fourth sub-pixels SP1 and SP4 may vary in a range between a second distance d2 and a third distance d3. In this connection, the second distance d2 is smaller than the first distance d1, while the third distance d3 is greater than the first distance d1.

That is, due to the configuration in which each of the data-lines 141 and 144 includes the multi angle-shaped portion (120 in FIG. 3) having the at least one inclined line (121 in FIG. 3), the minimum space d2 between the light-emitting regions EAs of the outer first and fourth sub-pixels SP1 and SP4 may be smaller than the space d1 between the non-light emitting regions NEAs thereof. At this same time, the maximum space d3 between the light-emitting regions EAs of the outer first and fourth sub-pixels SP1 and SP4 may be greater than the space d1 between the non-light emitting regions NEAs thereof.

In this way, the space between portions of the projecting regions of the light-emitting regions EAs of the outer first and fourth sub-pixels SP1 and SP4 may be smaller than the space d1 between the non-light emitting regions NEAs thereof.

That is, the space between portions of the light-emitting regions EAs of the outer first and fourth sub-pixels SP1 and SP4 defining both outer lateral portions of each unit pixel UP respectively may be smaller than the space d1 between the non-light emitting regions NEAs thereof.

Thus, compared to a conventional case where the space between the light-emitting region EAs of the outer first and fourth sub-pixels SP1 and SP4 is kept constant equal to the first distance d1, the color mixing performance between light beams emitted from the outer first and fourth sub-pixels SP1 and SP4 may be improved in this aspect of the present disclosure due to the space smaller than the space D1. Therefore, this may effectively render the mixed color between the light-beams emitted from the outer first and fourth sub-pixels SP1 and SP4.

As shown in FIG. 5, each of the sub-pixels SP1, SP2, SP3 and SP4 may include the organic light-emitting element (OLED) placed in the light-emitting region (EA in FIG. 4), and the circuitry placed in the non-light emitting region (NEA in FIG. 4).

In one example, as shown in FIG. 2, the circuitry may include the storage capacitor Cst, and the first, second, and third thin-film transistors T1, T2, and T3.

The organic light-emitting element OLED may include an anode 201 corresponding to the light-emitting region EA. In this connection, the anode 201 may include an extension placed in the non-light emitting region NEA.

The first thin-film transistor T1 includes a gate electrode 211 spaced from the first scan-line 15a and adjacent to the light-emitting region (EA in FIG. 4), an active layer 212 partially overlapping the gate electrode 211, and a source electrode and a drain electrode respectively overlapping both opposite edges of the active layer 212.

In this connection, one of the source electrode and the drain electrode of the first thin-film transistor T1 is connected to the first power supply line 16, while the other thereof is superimposed on the extension of the anode 201 of the organic light-emitting element.

However, in the sub-pixel SP2 adjacent to the first power supply line 16, the first thin-film transistor T1 is directly connected to the first power supply line 16. On the other hand, in the sub-pixel SP1 spaced from the first power supply line 16 via at least one sub-pixel SP2, the first thin-film transistor T1 is connected to the first power supply line 16 via a first bridge pattern 16'.

The second thin-film transistor T2 includes a gate electrode including a portion of the first scan line 15a, an active layer 221 overlapping the gate electrode, and a source electrode and a drain electrode respectively overlapping both lateral edges of the active layer 221.

In this connection, one of the source and drain electrodes of the second thin-film transistor T2 is connected to the data-line 14, while the other thereof overlaps the gate electrode 211 of the first thin-film transistor T1.

The third thin-film transistor T3 includes a gate electrode including a portion of the second scan-line 15b, an active layer 231 overlapping the gate electrode, and a source electrode and a drain electrode respectively overlapping both lateral edges of the active layer 231.

In this connection, one of the source electrode and drain electrode of the third thin-film transistor T3 is connected to the reference power supply line 17, while the other thereof overlaps the extension of the anode 201.

However, in the sub-pixel SP1 adjacent to the reference power supply line 17, the third thin-film transistor T3 is directly connected to the reference power supply line 17. On the other hand, in sub-pixel SP2 spaced from the reference power supply line 17 via the at least one sub-pixel SP1, the third thin-film transistor T3 is connected to the reference power supply line 17 via a second bridge pattern 17'.

The storage capacitor Cst may be disposed in an overlapping region between at least one of the gate electrode 211 of the first thin-film transistor T1 and the electrode of the second thin-film transistor T2 connected thereto, and the extension of the anode 201.

As shown in FIG. 6, at least one of the first, second and third thin-film transistors T1, T2, and T3 (e.g., the second thin-film transistor T2) may include substrate 301, a light-shielding layer 310 disposed on the substrate 301, a buffer insulating film 302 covering the light-shielding layer 310, an active layer 221 disposed on the buffer insulating-film 302 and overlapped with the light-shielding layer 310, a gate insulating film 303 covering the active layer 221, a gate electrode 15a disposed on the gate insulating-film 303, an interlayer insulating film 305 covering the gate electrode 15a, and a source electrode 222 and a drain electrode 223 disposed on the interlayer insulating-film 305 and partially respectively overlapped with both lateral edges of the active layer 221.

In this connection, the data-line 14, the first power supply line 16 and the reference power supply line 17 may be disposed on the interlayer insulating-film 305 present at the same level as the source electrode 222 and the drain electrode 223.

Further, the display panel 10 of FIG. 1 further includes an intermediate insulating film 304 disposed between the gate insulating-film 303 and the interlayer insulating-film 305. The first and second bridge patterns 16' and 17' may be disposed on the intermediate insulating-film 304.

As noted above, according to the first aspect of the present disclosure, the data-line 14 is disposed along and between the light-emitting regions EAs of the two sub-pixels SP1 and SP2 adjacent in the first direction. The data-line 14 includes the at least one inclined line 121 and the straight line 122 extending in the first direction. Thus, the light-emitting regions EAs of the two adjacent sub-pixels SP1 and SP2 are symmetrical with each other in an inclined direction and are projected in a mutually facing direction.

Further, the two sub-pixels SP1 and SP2 defining the left half of each unit pixel UP and the two sub-pixels SP3 and SP4 defining the right half of each unit pixel UP may be formed to be symmetrical with each other around a boundary line between the inner second and third sub-pixels SP2 and SP3 corresponding to the center line of each unit pixel UP.

Thus, the light-emitting regions EAs of the outer first and fourth sub-pixels SP1 and SP4 of each unit pixel UP are mutually symmetrical with respect to the center line and protrude in the mutually facing direction. Therefore, the space d2 between the portions of the light-emitting regions EAs of the outer first and fourth sub-pixels SP1 and SP4 may be smaller to the space d1 between the non-light emitting regions NEAs of the outer first and fourth sub-pixels SP1 and SP4. Therefore, color mixing between the light beams as emitted from the outer first and fourth sub-pixels SP1 and SP4 may be easily rendered.

The two data lines 141 and 142 corresponding to the two sub-pixels SP1 and SP2 adjacent in the first direction may be disposed along and between the two sub-pixels SP1 and SP2.

In this regard, each data-line 14 includes the multi angle-shaped portion 120. The multi angle-shaped portion 120 corresponds to the light-emitting region EA and includes the at least one inclined line 121 and the straight line 122 extending in the first direction. That is, since a patterning process margin for an angled portion of each data-line 14 must be added to the space between the two data-lines 141 and 142, there is a problem that a reduction of the space between the two data lines 141 and 142 is limited.

To address this problem, according to the second aspect of the present disclosure, at least a portion of the multi angle-shaped portion 120 of the data-line 14 may be disposed at a different level than the straight-shaped portion 110.

Figure 7:
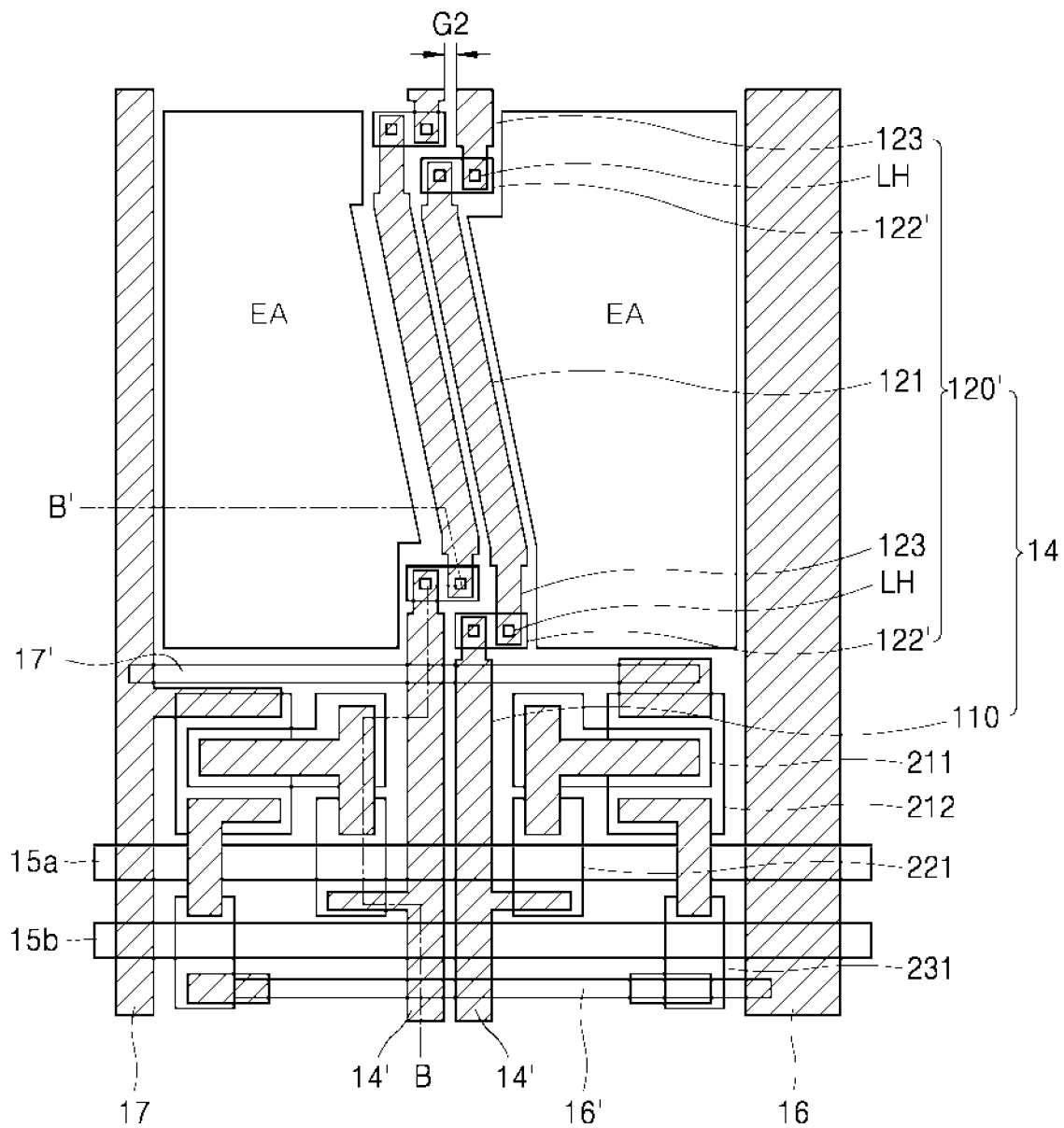
FIG. 7 shows two adjacent sub-pixels and corresponding data-lines in a display panel according to a second aspect of the present disclosure.
Figure 8:
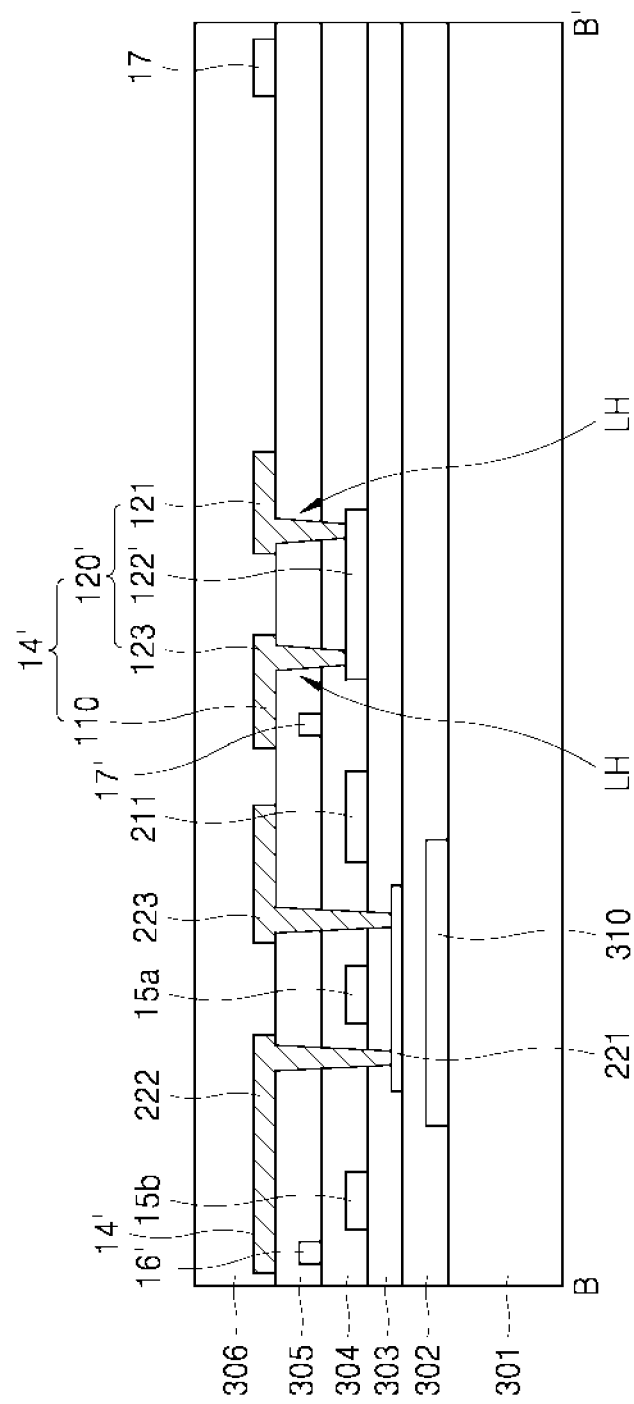
FIGS. 8, 9 and 10 show examples of a cross-section as taken in line B-B' of FIG. 7.
Figure 9:
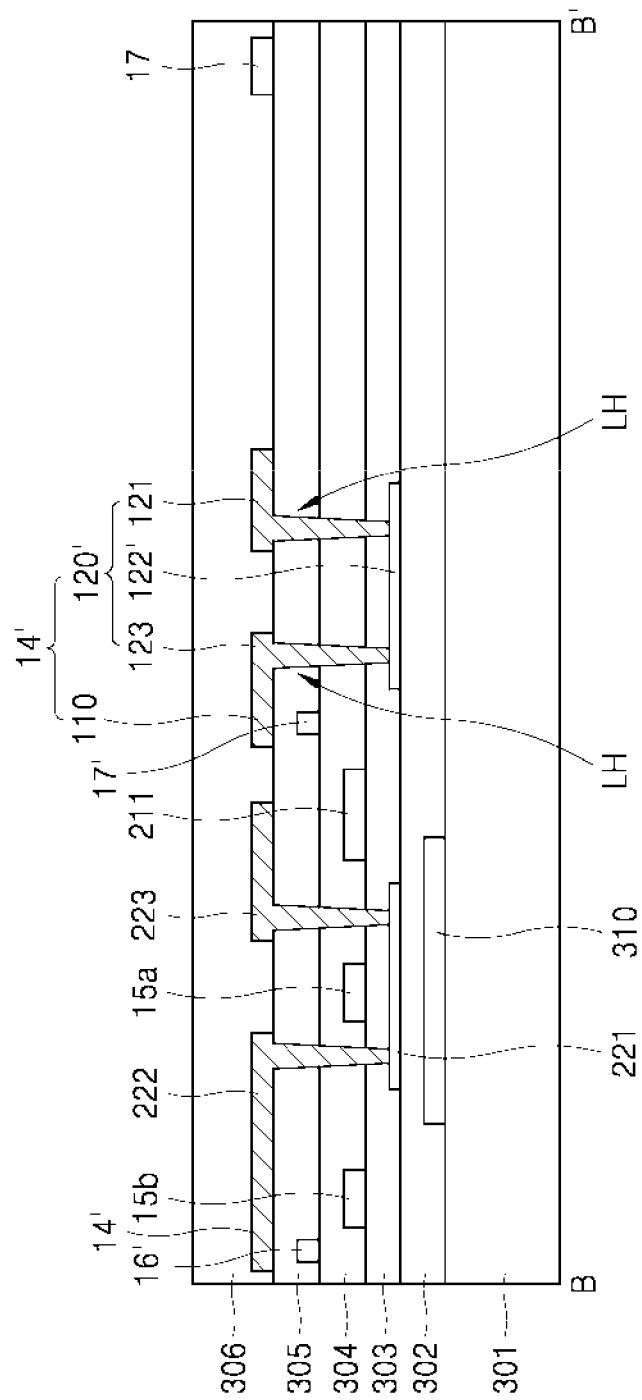
Figure 10:
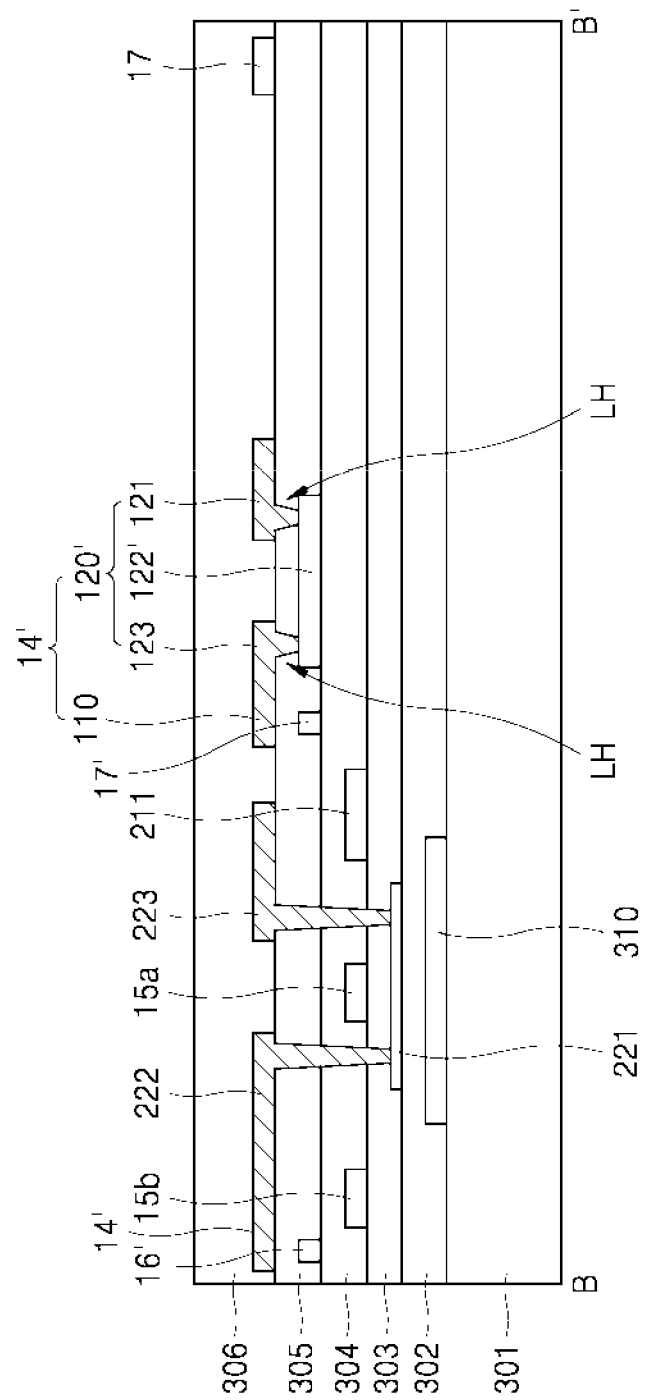

FIG. 7 shows two adjacent sub-pixels and corresponding data-lines in a display panel according to the second aspect of the present disclosure. FIGS. 8, 9 and 10 show examples of a cross section taken along B-B' of FIG. 7.

As shown in FIG. 7, the display panel according to the second aspect of the present disclosure has the same configuration as the first aspect shown in FIGS. 2 to 6 except that a portion of the multi angle-shaped portion 120' of the data-line 14' is disposed at a different level than the straight-shaped portion 110 in the second aspect. Therefore, the overlapping descriptions between the first aspect and the second aspect will be omitted.

As shown in FIG. 7, according to the second aspect, the multi angle-shaped portion 120' of the data-line 14' includes a straight line 122' extending in the first direction X. The straight line 122' may be disposed at a different level than the straight-shaped portion 110 and may be formed in a distinct pattern. The straight line 122' may be connected to the remaining portions 121 and 123 of the multi angle-shaped portion 120' or the straight-shaped portion 110 via a lines-contact hole LH.

As shown in FIG. 8, the straight line 122' extending in the first direction X of the multi angle-shaped portion 120' of the data-line 14' may be disposed at the same level as the first and second scan-lines 15a and 15b. That is, the straight line 122' may be disposed on the gate insulating-film 303.

Further, the straight-shaped portion 110 of the data-line 14', the inclined line 121 and the straight line 123 extending in the second direction Y of the multi angle-shaped portion 120' of the data-line 14' may be disposed at the same level as the source electrode and the drain electrode 222 and 223. That is, the straight-shaped portion 110 of the data-line 14', the inclined line 121 and the straight line 123 extending in the second direction Y of the multi angle-shaped portion 120' of the data-line 14' may be disposed on the interlayer insulating-film 305.

Alternatively, as shown in FIG. 9, the straight line 122' extending in the first direction X of the multi angle-shaped portion 120' of the data-line 14' may be disposed at the same level as the active layer 221. That is, the straight line 122' extending in the first direction X of the multi angle-shaped portion 120' of the data-line 14' may be disposed on the buffer insulating-film 302.

In this case, the active layer 221 may be made of an oxide semiconductor material, while the straight line 122' extending in the first direction X of the multi angle-shaped portion 120' of the data-line 14' may include a conducting oxide semiconductor material. Alternatively, the active layer 221 may be made of a low temperature grown polysilicon (LTPS) semiconductor material, while the straight line 122' extending in the first direction X of the multi angle-shaped portion 120' of the data-line 14' may include a heavily-doped low temperature grown polysilicon (LTPS) semiconductor material.

Alternatively, as shown in FIG. 10, the straight line 122' extending in the first direction X of the multi angle-shaped portion 120' of the data-line 14' may be disposed at the same level as the first and second bridge patterns 16' and 17'. That is, the straight line 122' extending in the first direction X of the multi angle-shaped portion 120' of the data-line 14' may be disposed on the intermediate insulating-film 304.

As noted above, according to the second aspect of the present disclosure, the straight line 122' extending in the first direction X of the multi angle-shaped portion 120' of the data-line 14' may be disposed at a different level than the straight-shaped portion 110 and may connect to the remaining portions 121 and 123 of the multi angle-shaped portion 120' via the lines-contact hole LH.

When as with the first aspect, all portions of the data-line 14 are disposed at the same level, the space (G1 in FIG. 5) between the two data-lines 14 must include the patterning process margin for the angled portion of the multi angle-shaped portion 120. This may lead to a limitation in reducing the space (G1 in FIG. 5).

However, when as with the second aspect, the portion 122' of the multi angle-shaped portion 120' of the data-line 14' is disposed at a different level than the straight-shaped portion 110, the space (G2 in FIG. 7) between the two data-lines 14' may include a contact-hole process margin smaller than the patterning process margin. As a result, the space (G2 in FIG. 7) between two data-lines 14' may be reduced compared to the space G1 between the two data-lines 14 according to the first aspect.

In this way, the space between the outer first and fourth sub-pixels SP1 and SP4 of each unit pixel UP may be further reduced. As such, the color blending of light-beams emitted from the first and fourth sub-pixels SP1 and SP4 may be easily rendered.

In the first and second aspects as shown in FIGS. 2 to 10, an example in which the multi angle-shaped portion 120 or 120' of the data-line 14 or 14' includes only one inclined line 121. However, the present disclosure is not limited thereto.

Figure 11:
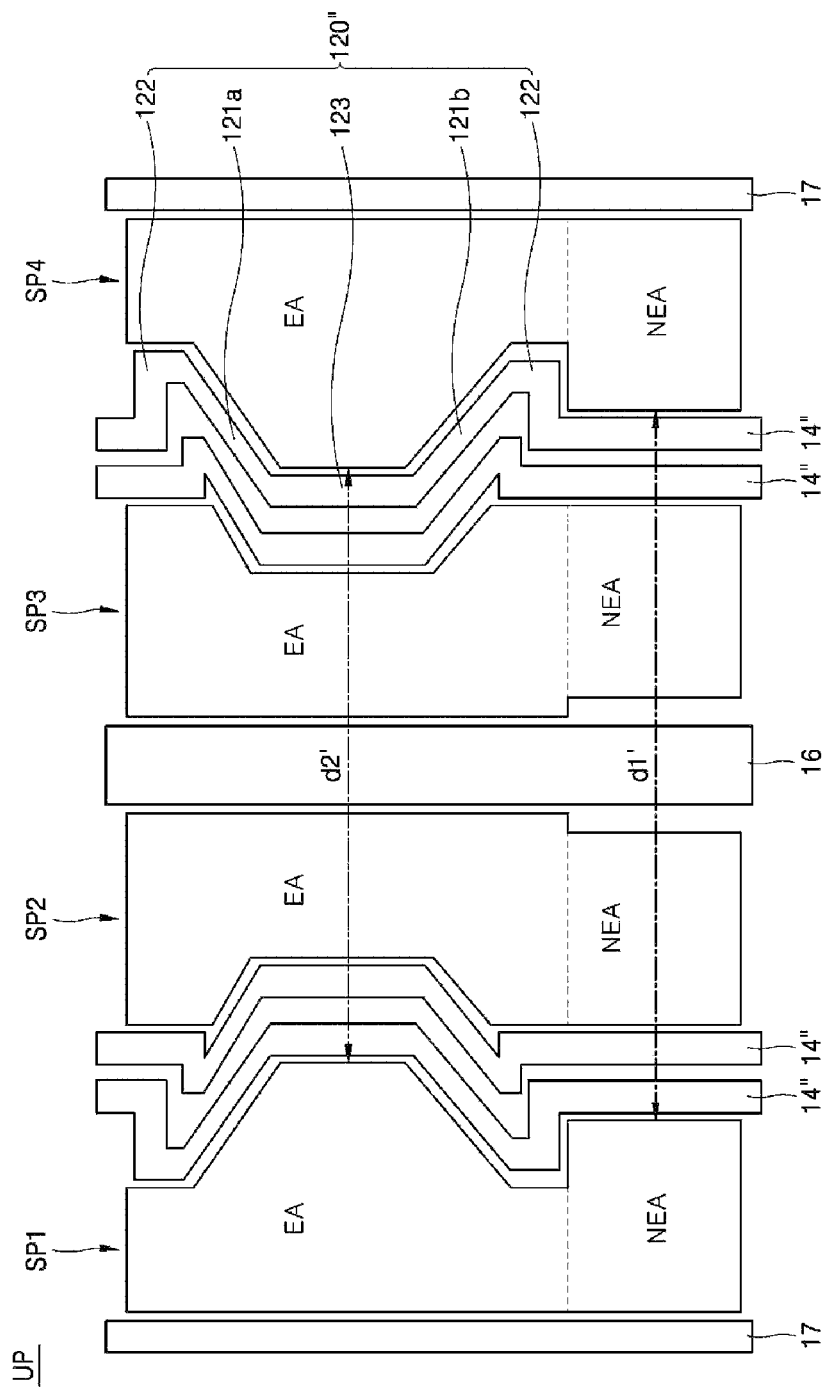
FIG. 11 shows first, second, third and fourth sub-pixels included in a unit pixel in a display panel according to a third aspect of the present disclosure.

FIG. 11 shows first, second, third and fourth sub-pixels included in a unit pixel in a display panel according to a third aspect of the present disclosure.

As shown in FIG. 11, the display panel according to the third aspect is identical in construction to the first aspect except that each data-line 14" includes two or more inclined lines. Therefore, overlapping description between the third aspect and the first aspect will be omitted.

As shown in FIG. 11, each of the two data-lines 14" corresponding to two adjacent sub-pixels SP1 and SP2 includes a multi angle-shaped portion 120" disposed along and between the light-emitting regions EA of the two adjacent sub-pixels SP1 and SP2. Further, as shown in FIG. 11, each of the two data-lines 14" corresponding to two adjacent sub-pixels SP3 and SP4 includes a multi angle-shaped portion 120" disposed along and between the light-emitting regions EA of the two adjacent sub-pixels SP3 and SP4.

The multi angle-shaped portion 120" of each of the two data-lines 14" includes two inclined lines 121a and 121b and a straight line 123 connecting the portions 121a and 121b and extending in the second direction Y.

Due to the configuration of the data-line 14", the light-emitting regions EAs of the outer first and fourth sub-pixels SP1 and SP4 of each unit pixel UP have respectively trapezoidal shapes protruding in a mutually facing direction.

Thus, compared to the first aspect, in the third aspect, the minimum space d2' between the light-emitting regions EAs of the outer first and fourth sub-pixels SP1 and SP4 may be further reduced. Therefore, the color mixing of the light-beams as emitted from the first and fourth sub-pixels SP1 and SP4 may be rendered more easily.

In the above description, numerous specific details are set forth in order to provide a thorough understanding of the present disclosure. The present disclosure may be practiced without some or all of these specific details. Examples of various aspects have been illustrated and described above. It will be understood that the description herein is not intended to limit the claims to the specific aspects described. On the contrary, it is intended to cover alternatives, modifications, and equivalents as may be included within the spirit and scope of the present disclosure as defined by the appended claims.

What is claimed is:

1. A display panel, wherein the display panel includes a plurality of sub-pixels arranged in a matrix form within a display region, wherein the display panel includes two or more unit pixels which are arranged in the matrix form within the display region and each of the two or more unit pixels emits light corresponding to each image frame, wherein each of the two or more unit pixels comprises a first sub-pixel, a second sub-pixel, a third sub-pixel and a fourth sub-pixel of the plurality of sub-pixels which are sequentially arranged in a first direction and correspond to different colors, wherein the display panel comprising:

an organic light-emitting element disposed in a light-emitting region of each of the plurality of sub-pixels;

circuitry disposed in a non-light emitting region of each of the plurality of sub-pixels, wherein the circuitry of each sub-pixel is configured to supply a driving current to the organic light-emitting element of each sub-pixel; and data lines corresponding to the plurality of sub-pixels, wherein each of the data lines is arranged in a second direction orthogonal to the first direction, wherein each of the data lines includes a straight line-shaped portion extending in the second direction and a polygonal-shaped portion connected to the straight line-shaped portion, wherein the polygonal-shaped portion includes an inclined line inclined with respect to both of the first direction and the second direction, and a straight line extending in the first direction, wherein any two data lines among the data lines corresponding to any two adjacent sub-pixels among the plurality of sub-pixels are disposed between the any two adjacent sub-pixels, wherein the straight line-shaped portions of the any two data lines are disposed between the non-light emitting regions of the any two adjacent sub-pixels, wherein the polygonal-shaped portions of the any two data lines are disposed between the light emitting regions of the any two adjacent sub-pixels, wherein in any one unit pixel among the two or more unit pixels, the first sub-pixel is adjacent to a different unit pixel from the any one unit pixel, the fourth sub-pixel is adjacent to an another different unit pixel from the any one unit pixel, the second sub-pixel and the third sub-pixel are disposed between the first sub-pixel and the fourth sub-pixel, the second sub-pixel is adjacent to the first sub-pixel, the third sub-pixel is adjacent to the fourth sub-pixel, wherein in the any one unit pixel, at least a portion of the light emitting region of the first sub-pixel is projected into the light emitting region of the second sub-pixel, and at least a portion of the light emitting region of the fourth sub-pixel is projected into the light emitting region of the third sub-pixel, and wherein in the any one unit pixel, a minimum distance of the first direction between the light emitting region of the first sub-pixel and the light emitting region of the fourth sub-pixel is smaller than a distance of the first direction between the non-light emitting region of the first sub-pixel and the non-light emitting region of the fourth sub-pixel.

2. The display panel of claim 1, wherein the light emitting regions of the two of adjacent sub-pixels are symmetrical with each other and are projected in a mutually facing direction, wherein the light emitting region of the first sub-pixel and the light emitting region of the second sub-pixel are symmetrical with each other and projected to the mutually facing direction, wherein the light emitting region of the third sub-pixel and the light emitting region of the fourth sub-pixel are symmetrical with each other and projected to the mutually facing direction, wherein a combination of the first sub-pixel and the second sub-pixel is symmetrical with a combination of the third sub-pixel and the fourth sub-pixel with respect to a boundary line between the second sub-pixel and the third sub-pixel.

3. The display panel of claim 1, wherein the distance of the first direction between the non-light emitting region of the first sub-pixel and the non-light emitting region of the fourth sub-pixel is defined as a first value,
wherein a distance of the first direction between the light emitting region of the first sub-pixel and the light emitting region of the fourth sub-pixel varies between a second value and a third value,
wherein the second value is smaller than the first value, and the third value is greater than the first value.

4. The display panel of claim 1, wherein the data lines includes a first data line corresponding to the first sub-pixel, a second data line corresponding to the second sub-pixel, a third data line corresponding to the third sub-pixel and a fourth data line corresponding to the fourth sub-pixel,
wherein the first data line and the second data line are disposed between the first sub-pixel and the second sub-pixel and are adjacent to each other,
wherein the third data line and the fourth data line are disposed between the third sub-pixel and the fourth sub-pixel and are adjacent to each other,
wherein a combination of the first data line and the second data line is symmetrical with a combination of the third data line and the fourth data line with respect to a boundary line between the second sub-pixel and the third sub-pixel.

5. The display panel of claim 1, wherein the straight line-shaped portion and the polygonal-shape portion are disposed in a same layer.

6. The display panel of claim 1, wherein at least a portion of the polygonal-shaped portion of each data line is disposed at a different layer from the straight line-shaped portion of each data line, wherein the at least a portion of the polygonal-shaped portion of each data line is connected via a contact hole to the straight line-shaped portion of each data line, wherein a remaining portion of the polygonal-shaped portion of each data line is disposed at a same layer as the straight line-shaped portion of each data line.

7. The display panel of claim 1, wherein a portion of the polygonal-shaped portion of each data-line corresponding to the straight line extending in the first direction is disposed at a different layer from the straight line-shaped portion of each data line, wherein a remaining portion of the polygonal-shaped portion of each data line is disposed at a same layer as the straight line-shaped portion of each data line.

8. The display panel of claim 1, wherein the display panel further includes:
a first power supply line for supplying a first drive voltage; and
a reference power supply line for supplying a reference voltage,
wherein each of the first power supply line and the reference power supply line extends in the second direction and is spaced from the data lines, and
wherein one of the first power supply line and the reference power supply line is disposed between the second sub-pixel and the third sub-pixel which are comprised the any one unit pixel, and the other of the first power supply line and the reference power supply line is disposed between the first sub-pixel of the any one unit pixel and a fourth sub-pixel of the different unit pixel which is adjacent to the any one unit pixel.

9. The display panel of claim 8, wherein the circuitry includes:

a first thin-film transistor connected in series with the organic light-emitting element for supplying the driving current to the organic light-emitting element wherein the first thin-film transistor and the organic light-emitting element are disposed between the first power supply line and a second power supply line for supplying a second drive voltage lower than the first drive voltage;
a storage capacitor disposed between a first node connected to a gate electrode of the first thin-film transistor and a second node between the first thin-film transistor and the organic light-emitting element;
a second thin-film transistor disposed between the first node and one of the data lines; and
a third thin-film transistor disposed between the second node and the reference power supply line.

10. The display panel of claim 9, wherein at least one of the first thin-film transistor, the second thin-film transistor, and the third thin-film transistors includes:
a light-shielding layer disposed on a substrate;
a buffer insulating-film disposed on and covered the light-shielding layer;
an active layer disposed on the buffer insulating-film, wherein the active layer overlaps the light-shielding layer;
a gate insulating-film disposed on and covered the active layer;
a gate electrode disposed on the gate insulating-film, wherein the gate electrode partially overlaps the active layer;
an interlayer insulating-film disposed on and covered the active layer and the gate electrode; and
source and drain electrodes disposed on the interlayer insulating-film, wherein the source and drain electrodes respectively overlap with both lateral edges of the active layer.

11. The display panel of claim 10, wherein the data-lines, the first power supply line, and the reference power supply line are disposed on the interlayer insulating-film.

12. The display panel of claim 10, wherein the first power supply line and the reference power supply line are disposed on the interlayer insulating-film,
wherein the straight line-shaped portion of each data-line is disposed on the interlayer insulating-film,
wherein at least a portion of the polygonal-shaped portion of each data-line is disposed at a different layer from the straight line-shaped portion of each data line;
wherein the at least a portion of the polygonal-shaped portion of each data-line is connected via a contact hole to the straight line-shaped portion of each data line,
wherein a remaining portion of the polygonal-shaped portion of each data line is disposed on the interlayer insulating-film.

13. The display panel of claim 12, wherein the display panel further includes:
an intermediate insulating film disposed between the gate insulating-film and the interlayer insulating-film;
a first bridge pattern disposed on the intermediate insulating-film and connected to the first power supply line via the contact hole; and
a second bridge pattern disposed on the intermediate insulating-film and connected to the reference power supply line via the contact hole.

14. The display panel of claim 13, wherein the at least a portion of the polygonal-shaped portion of each data-line corresponding to the straight line extending in the first direction is disposed on one of the substrate, the buffer insulating-film, the gate insulating-film, and the intermediate insulating-film.

15. The display panel of claim 1, wherein one of the first sub-pixel and the fourth sub-pixel corresponds to red and the other of the first sub-pixel and the fourth sub-pixel corresponds to green,
wherein one of the second sub-pixel and the third sub-pixel corresponds to white and the other of the second sub-pixel and the third sub-pixel corresponds to blue.

16. A display panel including a plurality of sub-pixels, comprising:
two or more unit pixels arranged in a matrix form, each of the two or more unit pixel emitting light corresponding to each image frame, and each of the two or more unit pixels including a first sub-pixel, a second sub-pixel, a third sub-pixel and a fourth sub-pixel of the plurality of sub-pixels which are sequentially arranged in a first direction and correspond to different color, wherein a combination of the first sub-pixel and the second sub-pixel is symmetrical with a combination of the third sub-pixel and the fourth sub-pixel with respect to a boundary line between the second sub-pixel and the third sub-pixel; and
data lines corresponding to the plurality of sub-pixels and arranged in a second direction intersecting the first direction,
wherein each of the data lines includes a straight line-shaped portion extending in the second direction, and a polygonal-shaped portion connected to the straight line-shaped portion,
wherein the polygonal-shaped portion includes an inclined line inclined with respect to both of the first direction and the second direction, and a straight line extending in the first direction,
wherein each of the plurality of sub-pixels includes a light emitting region corresponding to an organic light-emitting element and a non-emitting region corresponding to circuitry which supplies a driving current to the organic light-emitting element,
wherein any two data lines among the data lines corresponding to any two adjacent sub-pixels among the plurality of sub-pixels are disposed between the any two adjacent sub-pixels,
wherein the straight line-shaped portions of the any two data lines are disposed between the non-light emitting regions of the any two adjacent sub-pixels,
wherein the polygonal-shaped portions of the two of data lines are disposed between the light emitting regions of the any two adjacent sub-pixels,
wherein in any one unit pixel among the two or more unit pixels, at least a portion of the light emitting region of the first sub-pixel being an outer sub-pixel of the any one unit pixel is projected into the light emitting region of the second sub-pixel being inner sub-pixel of the any one unit pixel, and at least a portion of the light emitting region of the fourth sub-pixel being an outer sub-pixel of the any one unit pixel is projected into the light emitting region of the third sub-pixel being inner sub-pixel of the any one unit pixel, and
wherein in the any one unit pixel, a minimum distance of the first direction between the light emitting region of the first sub-pixel and the light emitting region of the fourth sub-pixel is smaller than a distance of the first direction between the non-light emitting region of the first sub-pixel and the non-light emitting region of the fourth sub-pixel.

17. The display panel of claim 16, wherein the distance of the first direction between the non-light emitting region of the first sub-pixel and the non-light emitting region of the fourth sub-pixel is defined as a first value,
wherein a distance of the first direction between the light emitting region of the first sub-pixel and the light emitting region of the fourth sub-pixel varies between a second value and a third value, and
wherein the second value is smaller than the first value, and the third value is greater than the first value.

18. The display panel of claim 16, wherein the data lines includes a first data line corresponding to the first sub-pixel, a second data line corresponding to the second sub-pixel, a third data line corresponding to the third sub-pixel and a fourth data line corresponding to the fourth sub-pixel,
wherein the first data line and the second data line are disposed between the first sub-pixel and the second sub-pixel and are adjacent to each other,
wherein the third data line and the fourth data line are disposed between the third sub-pixel and the fourth sub-pixel and are adjacent to each other,
wherein a combination of the first data line and the second data line is symmetrical with a combination of the third data line and the fourth data line with respect to a boundary line between the second sub-pixel and the third sub-pixel,
wherein the light emitting regions of the two of adjacent sub-pixels are symmetrical with each other and are projected in a mutually facing direction.

19. The display panel of claim 16, wherein one of the first sub-pixel and the fourth sub-pixel corresponds to red and the other of the first sub-pixel and the fourth sub-pixel corresponds to green.

20. The display panel of claim 16, wherein one of the second sub-pixel and the third sub-pixel corresponds to white and the other of the second sub-pixel and the third sub-pixel corresponds to blue.

* * * * *